United States Patent
Nagahiro

(10) Patent No.: US 9,450,121 B2
(45) Date of Patent: Sep. 20, 2016

(54) SOLID-STATE IMAGING DEVICE AND ELECTRONIC APPARATUS

(71) Applicant: Sony Corporation, Tokyo (JP)

(72) Inventor: Koji Nagahiro, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/567,067

(22) Filed: Dec. 11, 2014

(65) Prior Publication Data

US 2015/0171242 A1    Jun. 18, 2015

(30) Foreign Application Priority Data

Dec. 18, 2013  (JP) ................. 2013-260891

(51) Int. Cl.
*H01L 31/0336* (2006.01)
*H01L 27/146* (2006.01)
*H01L 31/032* (2006.01)
*H01L 31/09* (2006.01)

(52) U.S. Cl.
CPC ..... *H01L 31/0322* (2013.01); *H01L 27/14632* (2013.01); *H01L 27/14645* (2013.01); *H01L 31/09* (2013.01)

(58) Field of Classification Search
USPC .......................................... 257/184; 348/308
See application file for complete search history.

(56) References Cited

U.S. PATENT DOCUMENTS

2002/0163023 A1* 11/2002 Miida ............... H01L 27/14603
257/292
2010/0059843 A1*  3/2010 Ikuta ................... H01L 27/1464
257/432

FOREIGN PATENT DOCUMENTS

JP    2011-146635 A    7/2011

* cited by examiner

*Primary Examiner* — Zandra Smith
*Assistant Examiner* — Lawrence Tynes, Jr.
(74) *Attorney, Agent, or Firm* — Sheridan Ross P.C.

(57) ABSTRACT

A solid-state imaging device includes a photoelectric conversion device that includes a non-chalcopyrite-based compound semiconductor of at least one layer, which is lattice bonded or pseudo lattice bonded, and is formed on a silicon substrate, and a chalcopyrite-based compound semiconductor of at least one layer which is formed on the non-chalcopyrite-based compound semiconductor.

20 Claims, 14 Drawing Sheets

SOLID-STATE IMAGING DEVICE AND ELECTRONIC APPARATUS

CROSS REFERENCE TO RELATED APPLICATIONS

This application claims the benefit of Japanese Priority Patent Application JP 2013-260891 filed Dec. 18, 2013, the entire contents of which are incorporated herein by reference.

BACKGROUND

The present disclosure relates to a solid-state imaging device and an electronic apparatus, and more particularly to a solid-state imaging device and an electronic apparatus which can suppress a dark current.

As a solid-state imaging device (image sensor) using a semiconductor, a photodiode using a p-n coupling of semiconductor has been known. Such a solid-state imaging device is mounted on many electronic apparatuses such as digital cameras, video cameras, surveillance cameras, mobile terminals, light sensors, and the like.

A dark current can be mentioned as one of performance of the solid-state imaging device. The solid-state imaging device performs a photoelectric conversion from light to electricity using a photodiode on entering light. At that time, electricity derived regardless of the light is a dark current. How efficiently the photoelectric conversion is performed and whether or not the dark current can be suppressed determine sensitivity. Imaging in a dark place becomes possible as the sensitivity gets higher. In addition, since it is not generally necessary to emphasize an image by signal processing as the sensitivity gets higher, the image or the video has little noise.

In order to increase the sensitivity, a CuInGaSe2 film with high light absorption coefficient as a photoelectric conversion film is applied to an image sensor, and thereby high sensitivity is achieved. However, since the photoelectric conversion film is basically formed on an electrode by crystal growth, the photoelectric conversion film becomes polycrystalline. For this reason, a dark current by a crystal defect remarkably occurs.

In Japanese Unexamined Patent Application Publication No. 2011-146635, an image sensor which has a photoelectric conversion film made of a chalcopyrite-based compound semiconductor that is lattice matched on a silicon (Si) substrate and includes a Copper-aluminum-gallium-indium-sulfur-selenium-(CuAlGaInSSe)-based mixed crystal, or a Copper-aluminum-gallium-indium-zinc-sulfur-selenium (CuAlGaInZnSSe)-based mixed crystal is proposed.

SUMMARY

A chalcopyrite-based compound semiconductor lattice matched to a silicon (Si) has a metal such as copper (Cu), zinc (Zn), sulfur (S), and the like. However, at the beginning of being lattice matched, a metal is surely present in a Si interface. Since these metals create a defect level in the vicinity of a mid-gap of silicon (Si), a dark current occurs due to the defect level.

It is desirable to suppress a dark current.

According to an embodiment of the present disclosure, there is provided a solid-state imaging device, including a photoelectric conversion device that includes a non-chalcopyrite-based compound semiconductor of at least one layer, which is lattice bonded or pseudo lattice bonded, and is formed on a silicon substrate, and a chalcopyrite-based compound semiconductor of at least one layer which is formed on the non-chalcopyrite-based compound semiconductor.

In the embodiment, the photoelectric conversion device may further include a charge accumulation layer formed on the silicon substrate.

In the embodiment, the solid-state imaging device may be a backside illumination type.

In the embodiment, the solid-state imaging device may have a global shutter function.

In the embodiment, a first layer of the non-chalcopyrite-based compound semiconductor, which is in contact with the silicon substrate, may be made of atoms that do not have a defect level around a mid-gap of Si.

In the embodiment, the first layer of the non-chalcopyrite-based compound semiconductor, which is in contact with the silicon substrate, may be made of atoms that do not have a defect level within ±0.1 eV from a mid-gap of Si.

In the embodiment, the first layer of the non-chalcopyrite-based compound semiconductor, which is in contact with the silicon substrate, may be made of a combination of at least two or more of Li, Sb, N, P, As, Bi, Te, Ti, C, Mg, Se, Cr, Ta, Ag, Pt, B, Al, Ga, In, Tl, Pd, Na, Be, Ni, Mo, Hg, K, Sn, W, Pb, O, Fe, C, Cl, Ca, and F.

In the embodiment, the first layer of the non-chalcopyrite-based compound semiconductor, which is in contact with the silicon substrate, may include at least one of GaP, AlP, AgCl, and CaF2.

In the embodiment, the non-chalcopyrite-based compound semiconductor may have a band gap equal to or more than that of Si.

In the embodiment, a range of an electron affinity of the non-chalcopyrite-based compound semiconductor may be between a value which is smaller than an electron affinity of the chalcopyrite-based compound semiconductor by a predetermined value and a value which is greater than an electron affinity of Si by a predetermined value.

In the embodiment, the range of electron affinity of the non-chalcopyrite-based compound semiconductor may be between a value which is smaller than an electron affinity of the chalcopyrite-based compound semiconductor by 0.25 eV and a value which is greater than an electron affinity of Si by 0.25 eV.

In the embodiment, the photoelectric conversion device may have a charge blocking layer at least one of between the non-chalcopyrite-based compound semiconductor and the chalcopyrite-based compound semiconductor, and between the chalcopyrite-based compound semiconductor and an upper electrode.

In the embodiment, the non-chalcopyrite-based compound semiconductor may also serve as the charge blocking layer.

In the embodiment, the non-chalcopyrite-based compound semiconductor may be changed stepwise in a composition of materials or impurity concentration.

In the embodiment, the chalcopyrite-based compound semiconductor may be changed stepwise in a composition of materials or impurity concentration.

In the embodiment, the chalcopyrite-based compound semiconductor may be lattice matched or pseudo-lattice matched.

In the embodiment, the silicon substrate may be formed of p-type silicon, and the charge accumulation layer may be formed of n-type silicon.

The portion of a porous shape is made of a metallic material.

The portion of a porous shape is made of a resin-based material.

According to another embodiment of the present disclosure, there is provided an electronic apparatus, including a solid-state imaging device including a photoelectric conversion device that includes a non-chalcopyrite-based compound semiconductor of at least one layer, which is lattice bonded or pseudo lattice bonded, and is formed on a silicon substrate, and a chalcopyrite-based compound semiconductor of at least one layer which is formed on the non-chalcopyrite-based compound semiconductor, an optical system which allows an incident light to be incident on the solid-state imaging device, and a signal processing circuit which processes an output signal output from the solid-state imaging device.

In the embodiment, the photoelectric conversion device may further include a charge accumulation layer formed on the silicon substrate.

In the embodiment, the electronic apparatus may be a backside illumination type.

In the embodiment, the electronic apparatus may have a global shutter function.

In the embodiment, the chalcopyrite-based compound semiconductor may be lattice matched or pseudo lattice matched.

According to the embodiment of the present disclosure, a photoelectric conversion device is included in which a non-chalcopyrite-based compound semiconductor of at least one layer is formed on a silicon substrate, which is lattice bonded or pseudo lattice bonded, and a chalcopyrite-based compound semiconductor of at least one layer is formed on the non-chalcopyrite-based compound semiconductor.

According to the embodiments of the present disclosure, it is possible to suppress a dark current. In particular, according to the embodiments of the present disclosure, it is possible to suppress a dark current even if using a chalcopyrite-based material for a photoelectric conversion layer.

The effects described in the present specification are not more than exemplification, effects of the present disclosure are not limited to effects described in the present specification, and additional effects may be possible.

DETAILED DESCRIPTION OF EMBODIMENTS

Hereinafter, modes for carrying out the present disclosure (hereinafter, also referred to as an embodiment) will be described. A description will proceed in a following order.

0. Schematic configuration example of solid-state imaging device

1. First Embodiment (Examples of a basic solid-state imaging device of the present disclosure)

2. Second Embodiment (Examples of a solid-state imaging device including a band gap of each color)

3. Third Embodiment (Examples of a solid-state imaging device including a charge blocking layer)

4. Fourth Embodiment (Examples of a solid-state imaging device including a plurality of dark current suppression layers)

5. Fifth Embodiment (Examples of a solid-state imaging device including a specific dark current suppression layer)

6. Sixth Embodiment (Examples of a solid-state imaging device including a dark current suppression layer also serving as a charge blocking layer)

7. Seventh Embodiment (Examples of a backside illumination-type solid-state imaging device)

8. Eighth Embodiment (Examples of a solid-state imaging device having a global shutter function)

9. Ninth Embodiment (Examples of an electronic apparatus)

0. Schematic Configuration Example of Solid-State Imaging Device

Schematic Configuration Example of Solid-State Imaging Device

Figure 1:
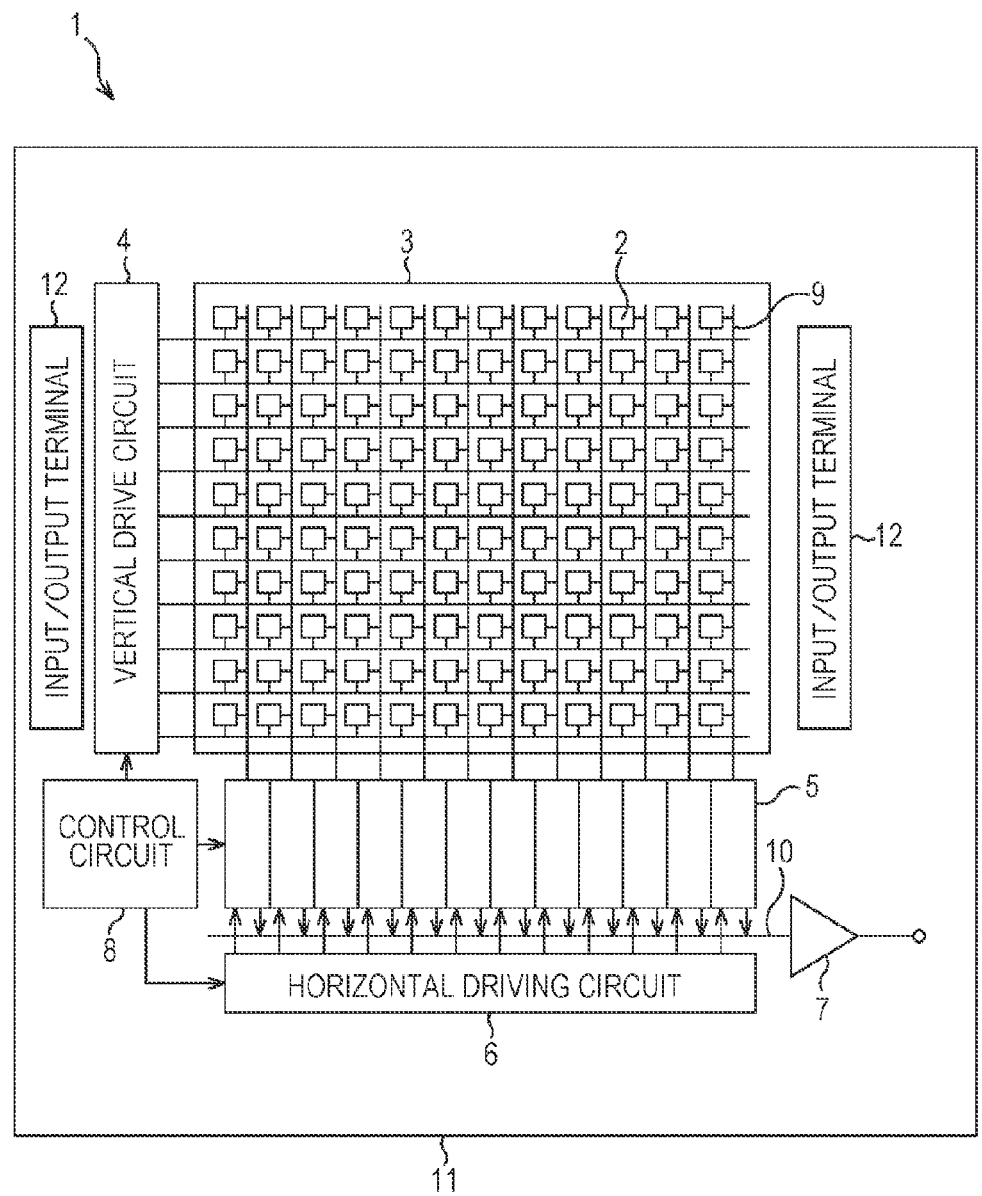
FIG. 1 is a block diagram which shows a schematic configuration example of a solid-state imaging device to which the present disclosure is applied.

FIG. 1 shows a schematic configuration example of an example of a Complementary Metal Oxide Semiconductor (CMOS) solid-state imaging device applied to each embodiment of the present disclosure.

As shown in FIG. 1, a solid-state imaging device (device chip) 1 is configured to have a pixel region (so-called imaging region) 3 in which pixels 2 including a plurality of photoelectric conversion devices are regularly arranged on a semiconductor substrate 11 (for example, silicon substrate) in a two-dimensional manner, and a peripheral circuit portion.

The pixels 2 have a photoelectric conversion device (for example, photodiode) and a plurality of pixel transistors (so-called MOS transistor). For example, the plurality of pixel transistors can be configured to have three transistors of a transfer transistor, a reset transistor, and an amplification transistor, and can be configured to have four transistors by further adding a selection transistor. An equivalent circuit of each pixel 2 (unit pixel) is the same as a general circuit, such that a detailed description will be omitted herein.

In addition, the pixels 2 can have a shared pixel structure. The pixel shared structure is configured to have a plurality of photodiodes, a plurality of transfer transistors, a floating diffusion to be shared, and another pixel transistor to be shared.

The peripheral circuit portion is configured to have a vertical drive circuit 4, a column signal processing circuit 5, a horizontal drive circuit 6, an output circuit 7, and a control circuit 8.

The control circuit 8 receives instruction data of instructing an input clock, an operation mode, or the like, and outputs data such as internal information of the solid-state imaging device 1 and the like. Specifically, the control circuit 8 generates a clock signal or a control signal which serves as a reference of operations of the vertical drive circuit 4, the column signal processing circuit 5, and the horizontal drive circuit 6 based on a vertical synchronization signal, a horizontal synchronization signal, and a master clock. Then, the control circuit 8 inputs these signals into the vertical drive circuit 4, the column signal processing circuit 5, and the horizontal drive circuit 6.

The vertical drive circuit 4 is configured from, for example, a shift register, selects a pixel driving wiring, supplies a pulse for driving the pixels 2 to the selected pixel driving wiring to drive the pixels 2 on a row basis. Specifically, the vertical drive circuit 4 selects and scans each of the pixels 2 of a pixel region 3 sequentially in a vertical direction on a row basis, and supplies a pixel signal to the column signal processing circuit 5 based on a signal charge generated according to an amount of received light in a photoelectric conversion device of each of the pixels 2 through a vertical signal line 9.

The column signal processing circuit 5 is disposed in, for example, each column of the pixels 2, and performs signal processing such as noise removal and the like on a signal output from the pixels 2 of one row portion in each pixel column. Specifically, the column signal processing circuit 5 performs signal processing such as Correlated Double Sampling (CDS) for removing a fixed pattern noise of the pixels 2, signal amplification, Analog/Digital (A/D) conversion, or the like. A horizontal selection switch (not shown) is provided to be connected between an output terminal of the column signal processing circuit 5 and the horizontal signal line 10.

For example, the horizontal drive circuit 6 is configured to have, for example, a shift register, and sequentially selects each column signal processing circuit 5 by sequentially outputting horizontal scanning pulses to output a pixel signal from each column signal processing circuit 5 to the horizontal signal line 10.

The output circuit 7 performs signal processing on a signal sequentially supplied from each of the column signal processing circuits 5 through a horizontal signal line 10 to output the signal. For example, the output circuit 7 performs only buffering in some cases, and performs black level adjustment, column variation correction, various digital signal processing, and the like in some cases.

An input/output terminal 12 is provided so as to exchange a signal between outside and the input/output terminal 12.

First Embodiment

First Configuration Example of a Solid-State Imaging Device

Figure 2:
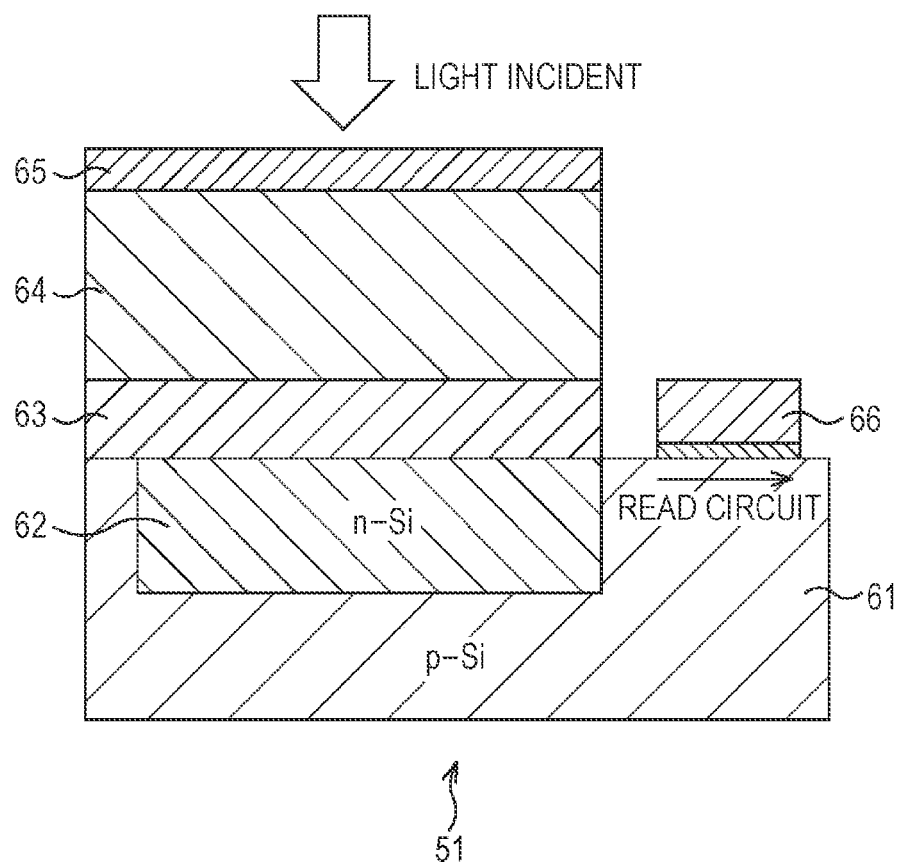
FIG. 2 is a cross-sectional view which shows a configuration example of a solid-state imaging device of a first embodiment of the present disclosure.

FIG. 2 is a cross-sectional view of the solid-state imaging device to which the present disclosure is applied. A basic configuration example of one photoelectric conversion device which configures the solid-state imaging device is shown in an example of FIG. 2.

The silicon substrate 61 of the solid-state imaging device 51 of FIG. 2 is formed of p-type silicon. The charge accumulation layer 62 is formed on the silicon substrate 61. The charge accumulation layer 62 is made of, for example, n-type silicon formed on the silicon substrate 61.

The dark current suppression layer 63 which is lattice bonded is formed on the charge accumulation layer 62. The dark current suppression layer 63 is made of a material that does not create a defect level in (around) mid-gap of silicon, for example, non-chalcopyrite-based material. The material includes a material mainly involving gallium phosphorus (GaP). In addition to GaP, a material of the dark current suppression layer 63 includes a material mainly involving, for example, AlP, AgCl, CaF2, and the like.

The photoelectric conversion layer 64 which is lattice matched is formed on the dark current suppression layer 63. The photoelectric conversion layer 64 is made of a chalcopyrite-based material including a copper-aluminum-gallium-indium-sulfur-selenium (hereinafter, referred to as CuAlGaInSSe)-based mixed crystal, or a copper-aluminum-gallium-indium-zinc-sulfur-selenium (hereinafter, referred to as CuAlGaInZnSSe)-based mixed crystal.

An electrode layer 65 having transparency is formed on the photoelectric conversion layer 64. The electrode layer 65 is made of, for example, transparent electrode materials such as indium tin oxide (ITO), zinc oxide, indium zinc oxide, and the like.

It is possible to connect the electrode layer 65 to a ground by applying metal wirings on the electrode layer 65 and to prevent charge accumulation by holes. Potential gradient to the charge accumulation layer 62 is made by applying a negative bias to the electrode layer 65, and thereby transfer becomes easy. However, it does not have to apply a bias to the electrode layer 65, and the photoelectrons are naturally moved to the charge accumulation layer 62 side due to a energy difference.

This photoelectron is read by a transfer gate 66 made of gate MOS formed on the silicon substrate 61. More preferably, the solid-state imaging device 51 may be made so that signals are not electrically mixed, for example, a resist mask is formed and is separated on a pixel basis by a reactive ion etching (RIE) process and the like. At this time, not only the electrode layer 65 but also the photoelectric conversion layer 64 is separated in the solid-state imaging device 51. In order to increase a light collection ratio, on-chip lens (microlens) for each pixel may be formed.

The solid-state imaging device 51 has a basic configuration as described above.

The dark current suppression layer 63 improves crystallinity by allowing epitaxial growth on the silicon substrate 61 as one method of lattice matching, and does not make a defect level in (around) mid-gap of silicon due to material of the dark current suppression layer 63 at a silicon interface, and thereby a dark current is lowered.

The photoelectric conversion layer 64 which is made of a chalcopyrite-based material allows epitaxial growth on the dark current suppression layer 63 lattice matched onto the silicon substrate 61 as a method of lattice matching, and thereby crystallinity is improved and a dark current is reduced as a result. The dark current suppression layer 63 directly in contact with the silicon substrate 61 may be lattice matched, and the photoelectric conversion layer 64 is preferably lattice matched, but may not be lattice matched.

By the above, even with a use of a chalcopyrite-based material which includes a material creating a defect level due to the material at a silicon interface with high light absorption coefficient for the photoelectric conversion layer 64, a solid-state imaging device with high sensitivity and low dark current is provided.

For example, an epitaxial growth method includes a Molecular Beam Epitaxy (MBE) method, a Metal Organic Chemical Vapor Deposition (MOCVD) method, a Liquid Phase Epitaxy (LPE) method, and the like. In other words, a method for epitaxial growth may be basically any film forming method.

Figure 3:
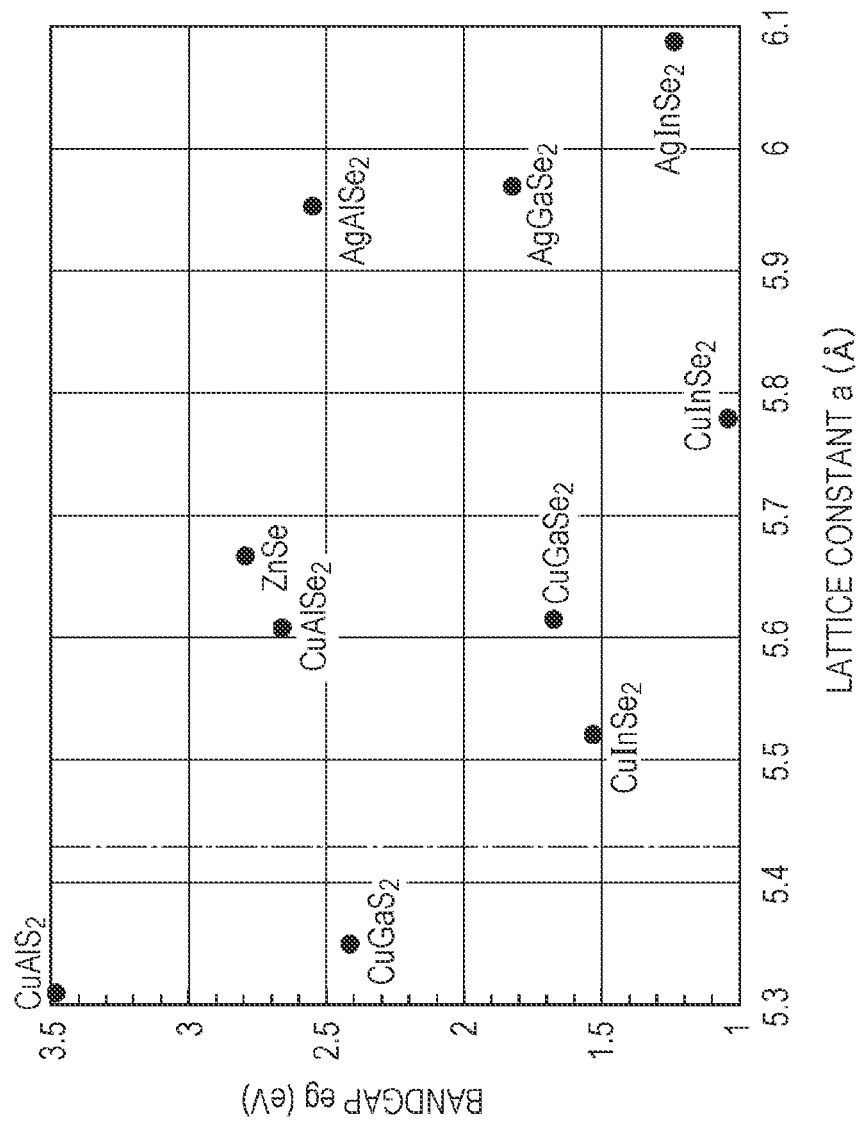
FIG. 3 is a diagram which shows a band gap and a lattice constant of a chalcopyrite-based material.

A lattice constant and a band gap of the chalcopyrite-based material are shown in FIG. 3. A lattice constant a of a silicon (Si) is a=5.431 Å as shown by a dashed line in FIG. 3. As a mixed crystal which can be formed by being lattice matched to the lattice constant value, there is a CuAlGaIn-SSe-based mixed crystal. The CuAlGaInSSe-based mixed crystal can cause epitaxial growth on the silicon substrate 61. In addition, it is understood that the chalcopyrite-based material which is lattice matched to a silicon surely has metals such as Cu, Zn, S, and the like which create a defect level in the vicinity of a mid-gap of Si.

Incidentally, the dark current suppression layer 63 and the photoelectric conversion layer 64 are desirably lattice matched, but may be pseudo lattice matched using the ultra-lattice within a critical film thickness to be formed. If within the critical film thickness, it is possible to prevent crystallinity from being damaged without a defect of misfit transition.

However, since a change in reduction of the critical thickness due to a large lattice constant difference is large, an application range is limited. The critical thickness is defined by a formula of Matthews and Blakeslee shown in Formula (1) below.

$$h_c = \frac{a_\varepsilon}{\sqrt{2}\pi f} \frac{1 - \frac{v}{4}}{1+v}\left(\ln\frac{h_c\sqrt{2}}{a_\varepsilon} + 1\right) \quad (1)$$

In addition, the charge accumulation layer 62 of the silicon substrate 61 can be formed by, for example, ion implantation and subsequent activation annealing.

The transfer gate 66 on the silicon substrate 61 is, for example, a gate MOS. The gate MOS can be formed, for example, by forming a silicon oxide film on the silicon substrate 61 by thermal oxidation and depositing a polycrystalline silicon on the formed silicon oxide film by Chemical Vapor Deposition (CVD).

The electrode layer 65 can be formed by laminating, for example, an indium tin oxide (ITO) by a sputtering deposition method.

Furthermore, the dark current suppression layer 63 is made of a material which does not create a defect level in (around) a mid-cap of silicon, specifically an atom (atom shown below) which does not create a defect level within ±0.1 eV from the mid-cap of silicon. For example, the dark current suppression layer 63 is made of a combination of at least two or more of Li, Sb, N, P, As, Bi, Te, Ti, C, Mg, Se, Cr, Ta, Ag, Pt, B, Al, Ga, In, Tl, Pd, Na, Be, Ni, Mo, Hg, K, Sn, W, Pb, O, Fe, C, Cl, Ca, and F. In particular, the dark current suppression layer is configured to include at least one of gallium phosphide (GaP) as described above, AlP, AgCl, and CaF2.

As a basis for a defect level depth ±0.1 eV in silicon, ShockleyReadHall model shown in Formula (2) below as a model for indirect generation and recrystallization through a defect is generally known.

$$R_{SRH} = \frac{pn - n_i^2}{\tau_p[n + n_i * \exp(E_t/kT)] + \tau_n[p + n_i * \exp(-E_t/kT)]} \quad (2)$$

Figure 4:
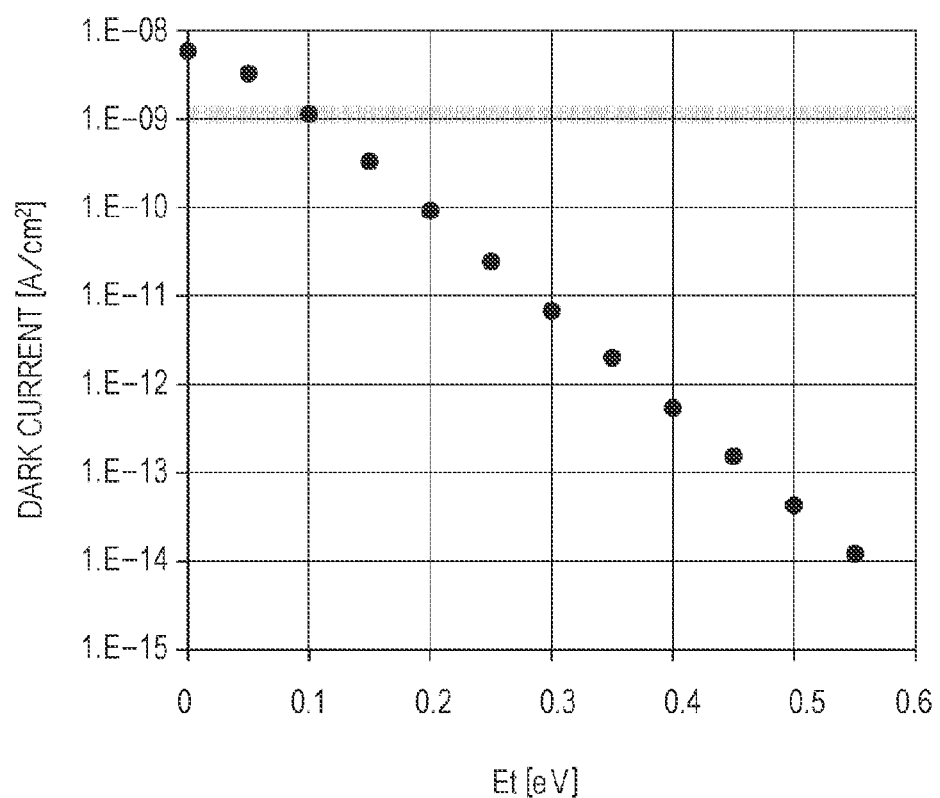
FIG. 4 is a diagram which shows a relationship between a dark current and a defect depth.

FIG. 4 shows a relationship between a dark current and a defect depth using a following general value in the formula (2) described above. τp=τn=50 [usec], p=1e5, n=1e15, ni=1.5e10 [cm-3]. In order to convert a generation route of carrier into a current density, a thickness of a generation region (≅a depth of a general valid sensor) is 5 [um]. In Han, S.-W. et al, Low dark current CMOS image sensor pixel with photodiode structure enclosed by P-well, Electronics Letters, Vol. 42, Issue 20, September, 2006 (hereinafter, referred to as NPL 1), a dark current of a general CMOS image sensor is described to be about 1.E-09 [A/cm2]. A horizontal line shown in FIG. 4 is 1.E-09[A/cm2], and indicates that the dark current is deteriorated when having a defect level within at least 0.1 eV from a mid-gap of silicon.

In addition, in James P. Lavine, the Effect of Potential Obstacles on Charge Transfer in Image Sensors, IEEE TRANSACTIONS ON ELECTRON DEVICES, VOL. 44, NO. 10, OCTOBER 1997 (hereinafter, referred to as NPL 2), transfer time is described to be greatly deteriorated when a transfer barrier in a transfer path exceeds 0.25 eV. It is desirable that electron affinity of the dark current suppression layer 63 be within a predetermined range of electron affinity of silicon and chalcopyrite-based compound semiconductor, specifically, within ±0.25 eV.

The dark current suppression layer 63 preferably has a band gap larger than that of silicon so as to suppress a dark current. Moreover, when the dark current suppression layer 63 uses, for example, a material which is obtained by adding B, Al, In, Tl, N, As, Sb, and B, and mainly contains GaP, a solid-state imaging device which satisfies the three conditions described above can be provided.

That is, the three conditions are, for example, that the dark current suppression layer 63 is made of atoms which do not create a defect level within ±0.1 eV from the mid-gap of silicon, a range of an electron affinity of the dark current suppression layer 63 is between a value smaller than an electron affinity of the photoelectric conversion layer 64 by a predetermined value (0.25 eV) and a value greater than an electron affinity of silicon by a predetermined value (0.25 eV), and the dark current suppression layer 63 has a band gap equal to or more than that of silicon.

Second Embodiment

Second Configuration Example of the Solid-State Imaging Device

Figure 5:
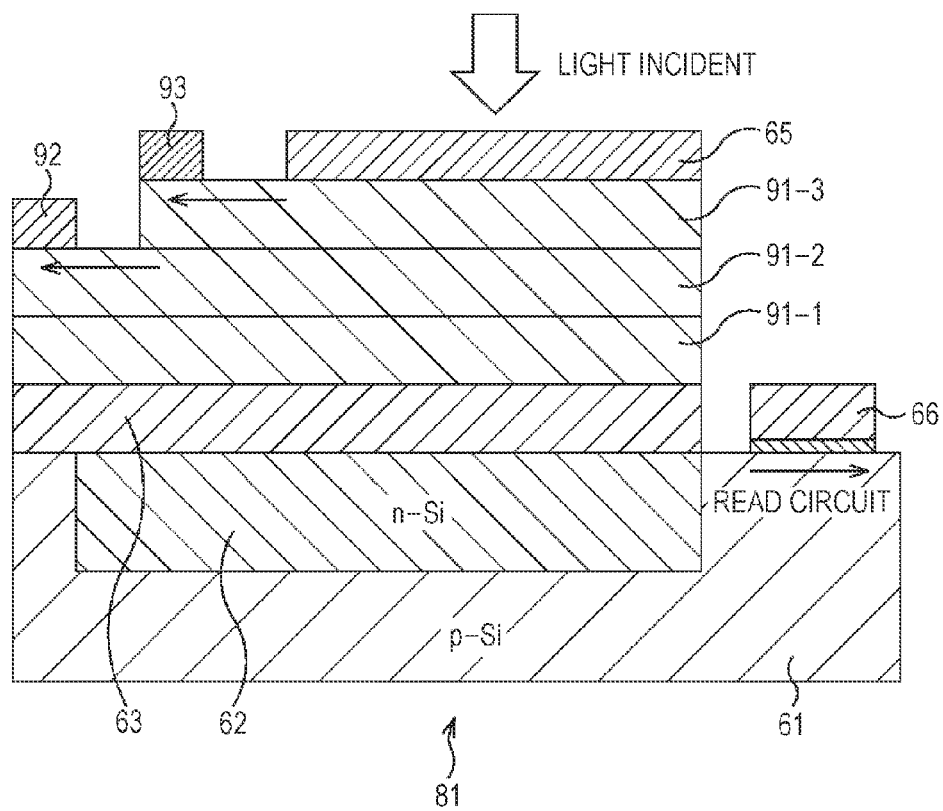
FIG. 5 is a cross-sectional view which shows a configuration example of a solid-state imaging device of a second embodiment of the present disclosure.

FIG. 5 is a cross-sectional view which shows another configuration example of the solid-state imaging device to which the present disclosure is applied. In an example of FIG. 5, it is exemplified that one photoelectric conversion device which configures the solid-state imaging device includes an optimal band gap for each color.

A solid-state imaging device 81 of FIG. 5 is in common with the solid-state imaging device 51 of FIG. 2 in that they include the silicon substrate 61, the charge accumulation layer 62, the dark current suppression layer 63, the electrode layer 65, and the transfer gate 66. The solid-state imaging device 81 of FIG. 5 is different from the solid-state imaging device of FIG. 2 in that the photoelectric conversion layer 64 is replaced with photoelectric conversion layers 91-1 to 91-3 and electrodes 92 and 93 are added.

Specifically, the solid-state imaging device 81 has the photoelectric conversion layers 91-1 to 91-3 for each color. The photoelectric conversion layer 91-1 formed on the dark current suppression layer 63 is a photoelectric conversion layer for R (red color), and for example, CuGa0.52In0.48S2 is used as a photoelectric conversion material for R spectra. A value of Al is 0, such that description of Al is omitted. The photoelectric conversion layer 91-2 formed on the photoelectric conversion layer 91-1 is a photoelectric conversion layer for G (green color), and for example, CuAl0.24Ga0.23In0.53S2 is used as a photoelectric conversion material for G spectra. The photoelectric conversion layer 91-3 formed on the photoelectric conversion layer 91-2 is a photoelectric conversion layer for B (blue color), and for example, CuAl0.36Ga0.64In1.28Se0.72 is used as a photoelectric conversion material for B spectra. In this case, each band gap is R: 2.00 eV, G: 2.20 eV, and B: 2.51 eV.

Figure 6:
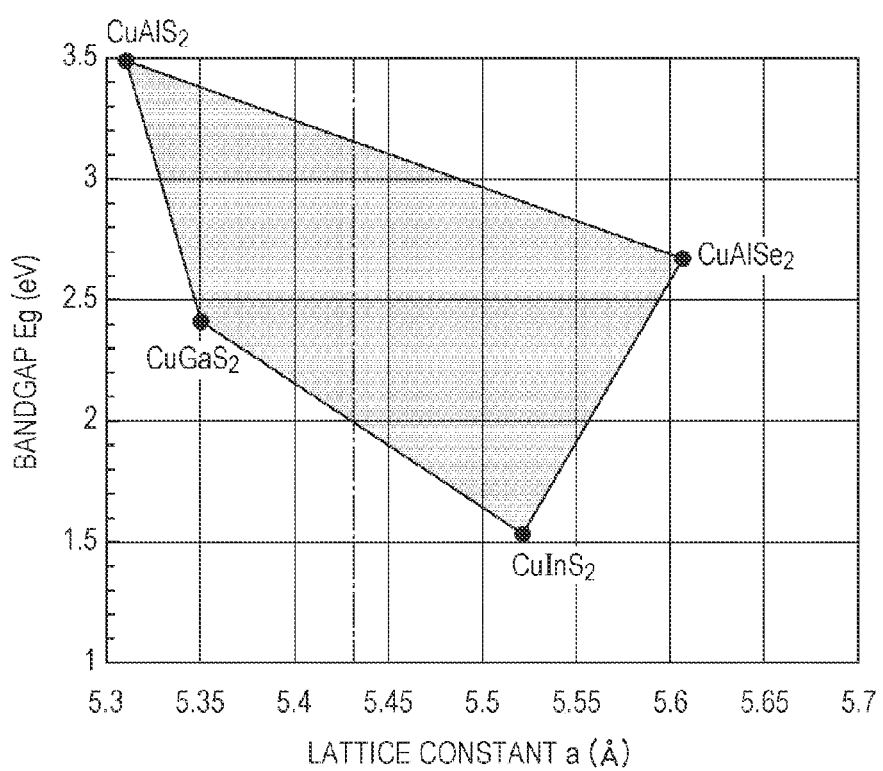
FIG. 6 is a diagram which describes a relationship between a solid composition of the chalcopyrite-based material and a band gap.

That is, as shown in FIG. 6, a chalcopyrite-based material made of a CuAlGaInSSe-based mixed crystal or a CuAlGaInZnSSe-based mixed crystal can change the band gap by changing a composition of the solid. For example, as shown in the combination described above, it is possible to efficiently absorb light by combining a composition of an optimal band gap for RGB.

Then, as shown in FIG. 5, the photoelectric conversion layer 91-1 for R, the photoelectric conversion layer 91-2 for G, and the photoelectric conversion layer 91-3 for B are sequentially laminated on the silicon substrate 61 (dark current suppression layer 63), and thereby spectrum can be performed in a depth direction.

A band gap region in which spectrum can be performed in a depth direction in this manner is as follows in consideration of the energy of RGB. That is, a band gap of the photoelectric conversion layer 91-1 for R may be in a range of 2.00 eV±0.1 eV (wavelength 590 nm to 650 nm). A band gap of the photoelectric conversion layer 91-2 for G may be in a range of 2.20 eV±0.15 eV (wavelength 530 nm to 605 nm). A band gap of the photoelectric conversion layer 91-3 for B may be in a range of 2.51 eV±0.2 eV (wavelength 460 nm to 535 nm).

As configurations at this time, the photoelectric conversion layer 91-1 for R is CuAlxGayInzS2, and satisfies 0≤x≤0.12, 0.38≤y≤0.52, 0.48≤z≤0.50, and x+y+z=1. The photoelectric conversion layer 91-2 for G is CuAlxGayInzS2, and satisfies 0.06≤x≤0.41, 0.01≤y≤0.45, 0.49≤z≤0.58, and x+y+z=1. The photoelectric conversion layer 91-3 for B is CuAlxGaySuSev, and satisfies 0.31≤x≤0.52, 0.48≤y≤0.69, 1.33≤u≤1.38, 0.62≤v≤0.67, and x+y+u+v=3 (or x+y=1 and u+v=2).

Each example is shown in an example of FIG. 5. It is understood that any composition includes Cu, Zn, and S which create a defect level in the vicinity of a mid-gap of silicon.

Moreover, in FIG. 6, Vegard's law (linear) are shown, but when bowing deviates from the Vegard's law, the composition of the above may be corrected to have a desired band gap, and thereby respective photoelectric conversion layers 91-1 to 91-3 is formed. In an example of FIG. 6, a lattice constant, a=5.431 Å, of silicon (Si) is indicated by a dashed line.

In an example of FIG. 5, an electrode 92 is provided at an upper left of the photoelectric conversion layer 91-2 for G, and an electrode 93 is provided at an upper left of the photoelectric conversion layer 91-3 for B. That is, in an example of FIG. 5, a photoelectron is read out to the charge accumulation layer 62 of the silicon substrate 61 is read for red light, and respective photoelectrons are read out to the electrodes 92 and 93 in a horizontal direction are read out for green light and blue light.

Although not shown, on the other side of respective layers, electrodes for discharging holes are also provided.

In the solid-state imaging device 81 configured in this manner, since information for three colors of RGB is obtained in a pixel, demosaicing is not desired, and a false color does not occur in principle, and thereby the solid-state imaging device 81 has a high resolution. In addition, a low pass filter is not desired, which is also a merit in cost. Furthermore, since not cutting light as an on-chip color filter (OCCF) does, the solid-state imaging device 81 has high light utilization efficiency and high sensitivity.

In addition, in an example of FIG. 5, a transfer barrier of a electron is seen in each interface of each of the photoelectric conversion layers 91-1 to 91-3 and the dark current suppression layer 63. This is determined by the electron affinity and a Fermi level. These transfer barriers of electrons can be controlled by changing a composition or impurity concentration of each photoelectric conversion layer. For example, these transfer barriers of electrons can be controlled by changing a composition or impurity concentration of a material stepwise or gradually using, for example, an MBE method, in one layer without increasing a layer.

Third Embodiment

Third Configuration Example of the Solid-State Imaging Device

Figure 7:
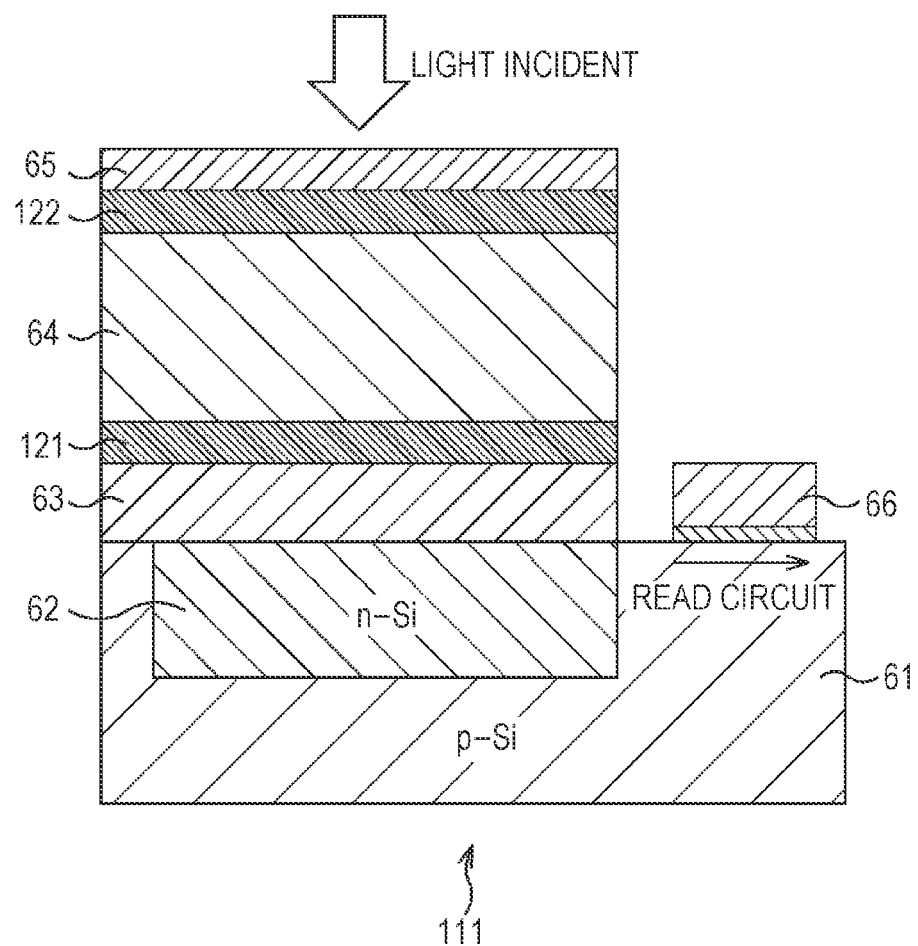
FIG. 7 is a cross-sectional view which shows a configuration example of a solid-state imaging device of a third embodiment of the present disclosure.

FIG. 7 is a cross-sectional view which shows another configuration example of the solid-state imaging device to which the present disclosure is applied. In an example of FIG. 7, it is exemplified that one photoelectric conversion device which configures the solid-state imaging device includes a charge blocking layer.

A solid-state imaging device 111 of FIG. 7 is in common with the solid-state imaging device 51 of FIG. 2 in that they include the silicon substrate 61, the charge accumulation layer 62, the dark current suppression layer 63, the photoelectric conversion layer 64, the electrode layer 65, and the transfer gate 66.

The solid-state imaging device 111 of FIG. 7 is different from the solid-state imaging device 51 of FIG. 2 in that charge blocking layers 121 and 122 are added to between the dark current suppression layer 63 and the photoelectric conversion layer 64, and to between the photoelectric conversion layer 64 and the electrode layer 65, respectively.

That is, when a difference between an energy level of a valence band of the photoelectric conversion layer 64 and a work function of the electrode layer 65 is small, a dark current is increased by a charge injection from the electrode layer 65. In addition, when the energy level difference between conduction bands of the silicon layer 61, the dark current suppression layer 63, and the photoelectric conversion layer 64 is small, a decrease of collection efficiency of photoelectrons occurs due to the recombination of photoelectrons caused by an excessive increase in hole concentration of the photoelectric conversion layer 64 due to the charge injection from the silicon layer 61.

Figure 8:
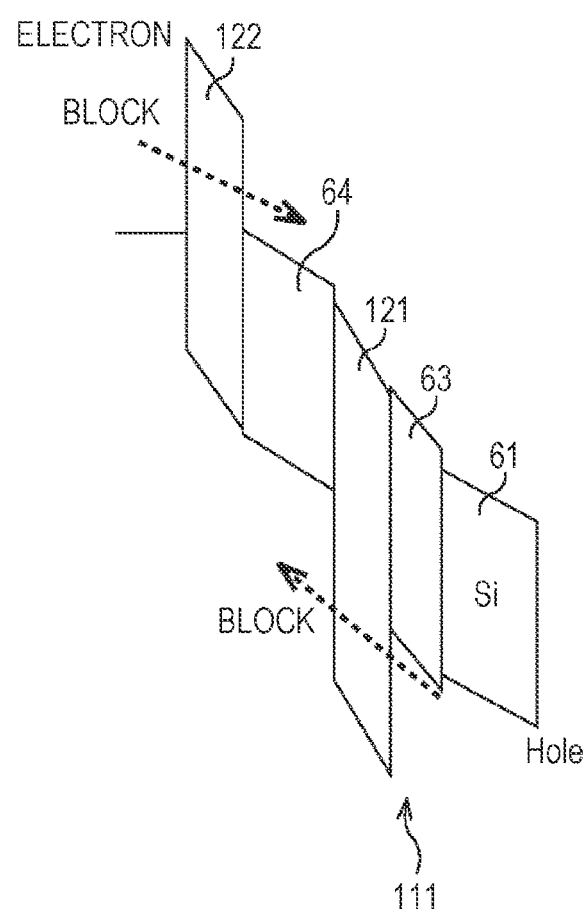
FIG. 8 is a diagram which describes an electron and a block of a hole.

The charge blocking layers 121 and 122 are formed between the dark current suppression layer 63 and the photoelectric conversion layer 64, and between the photoelectric conversion layer 64 and the electrode layer 65, respectively. As shown in FIG. 8, an electron is blocked by the charge blocking layer 121, and a hole is blocked by the charge blocking layer 122, such that it is possible to avoid the electron and the hole. Accordingly, a dark current is suppressed and the solid-state imaging device 111 having high photoelectron collection efficiency and high sensitivity is provided.

For example, a material mainly involving GaP, GaAs, GaN, TiO2, NiO, ZnO, ZnS, ZnSe, ZnTe, ZnRh2O4, SrCu2O2, SrTiO3, Ta2O5, In2S3, InP, In2O3, SnO2, SiC, AlP, AlSb, Al2O3, CdS, CdSe, CdTe, CdF2, Cu2O, CuS, CuAlO2, ZnMgS, and ZnMgSe is used for the charge blocking layer.

Figure 11:
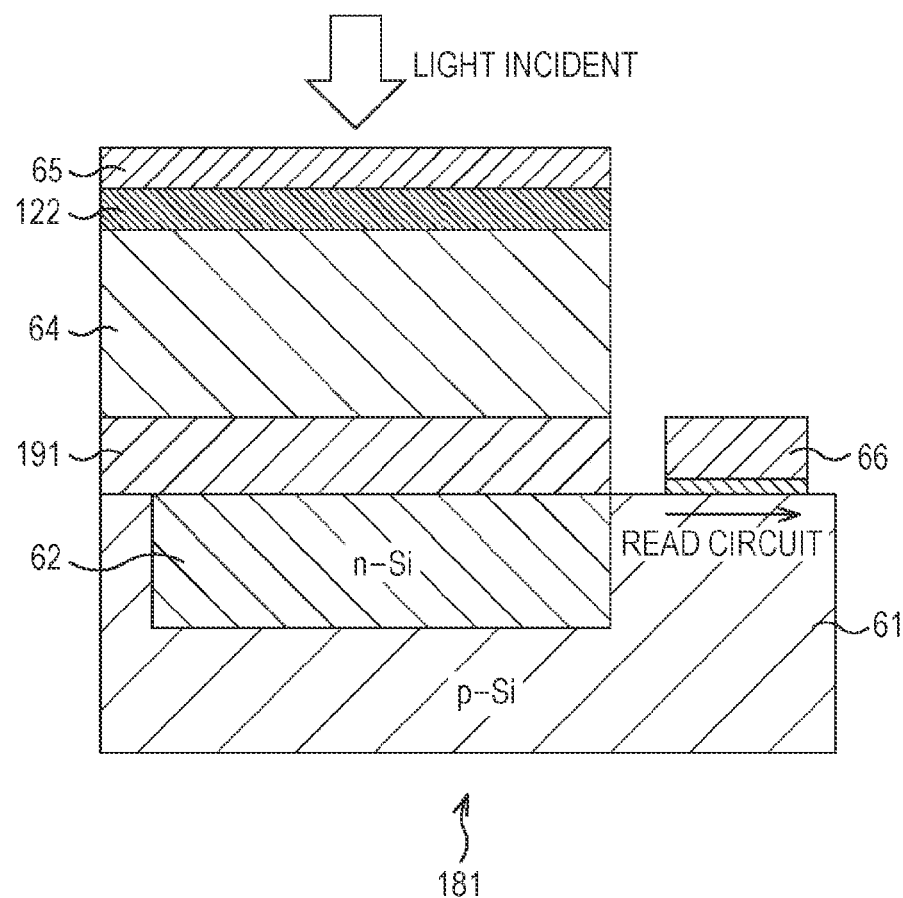
FIG. 11 is a cross-sectional view which shows a configuration example of a solid-state imaging device of a sixth embodiment of the present disclosure.

In addition, description will be provided referring to FIG. 11. At this time, it is possible to form a dark current suppression layer which also serves as a charge blocking layer by using a GaP-based material for the dark current suppression layer.

Fourth Embodiment

Fourth Configuration Example of the Solid-State Imaging Device

Figure 9:
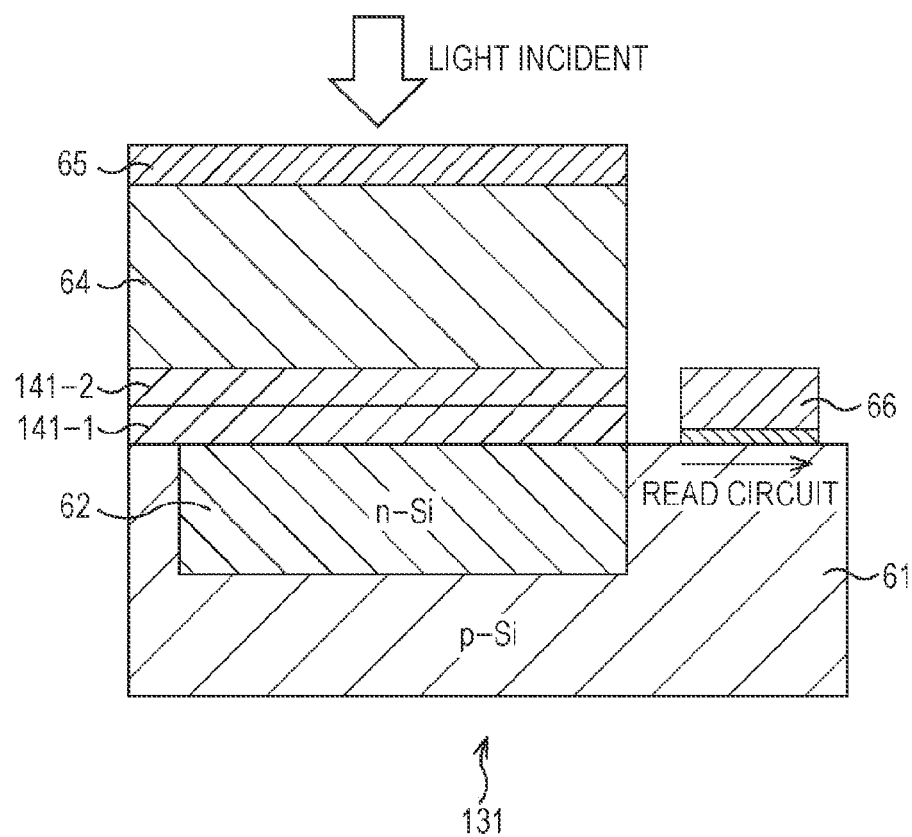
FIG. 9 is a cross-sectional view which shows a configuration example of a solid-state imaging device of a fourth embodiment of the present disclosure.

FIG. 9 is a cross-sectional view which shows another configuration example of the solid-state imaging device to which the present disclosure is applied. In an example of FIG. 9, it is exemplified that one photoelectric conversion device which configures the solid-state imaging device includes a plurality of dark current suppression layers.

A solid-state imaging device 131 of FIG. 9 is in common with the solid-state imaging device 51 of FIG. 2 in that they include the silicon substrate 61, the charge accumulation layer 62, the photoelectric conversion layer 64, the electrode layer 65, and the transfer gate 66. The solid-state imaging device 131 of FIG. 9 is different from the solid-state imaging device 51 of FIG. 2 in that the dark current suppression layer 63 is replaced with dark current suppression layers 141-1 and 141-2.

That is, as described above referring to FIG. 5, transfer barriers of electrons are seen in each interface of the dark current suppression layers 141-1 and 141-2 of FIG. 9. These transfer barriers of electrons can be controlled by changing a composition or impurity concentration of each of the dark current suppression layers 141-1 and 141-2. Moreover, these transfer barriers of electrons can be controlled by changing a composition or impurity concentration of a material stepwise or gradually using, for example, an MBE method, in one layer without increasing a layer.

Fifth Embodiment

Fifth Configuration Example of the Solid-State Imaging Device

Figure 10:
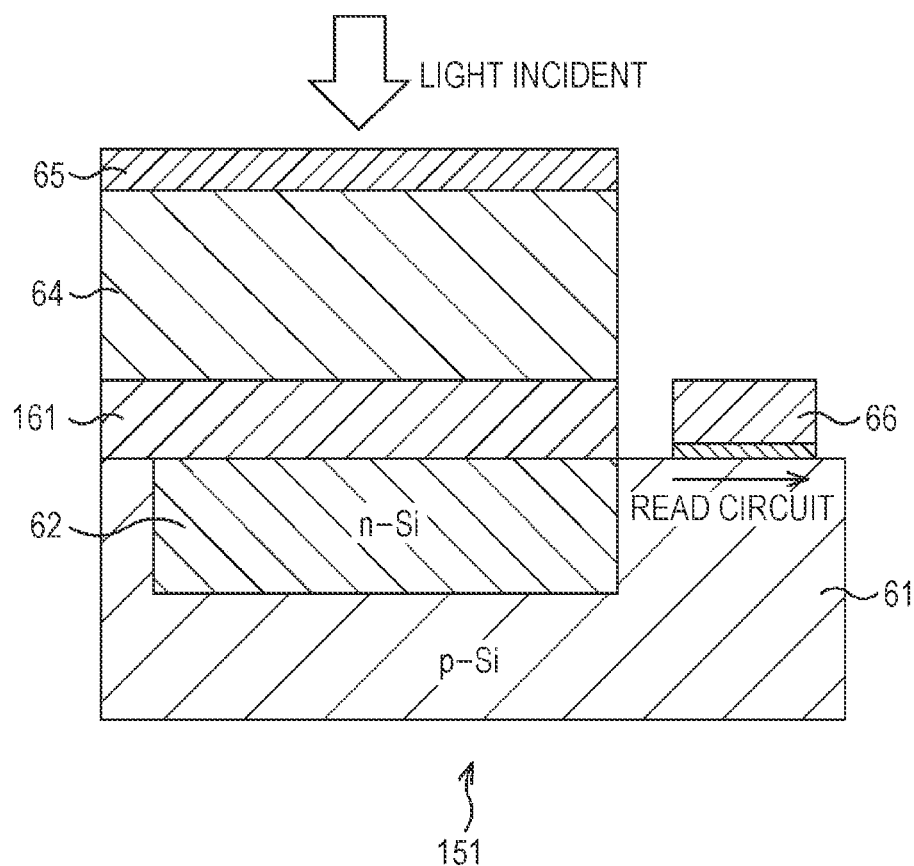
FIG. 10 is a cross-sectional view which shows a configuration example of a solid-state imaging device of a fifth embodiment of the present disclosure.

FIG. 10 is a cross-sectional view which shows another configuration example of the solid-state imaging device to which the present disclosure is applied. In an example of FIG. 10, it is exemplified that one photoelectric conversion device which configures the solid-state imaging device includes a dark current suppression layer whose electron affinity is smaller than 0.25 eV in each barrier layer.

A solid-state imaging device 151 of FIG. 10 is in common with the solid-state imaging device 51 of FIG. 2 in that they include the silicon substrate 61, the charge accumulation layer 62, the photoelectric conversion layer 64, the electrode layer 65, and the transfer gate 66. The solid-state imaging device 151 of FIG. 10 is different from the solid-state imaging device 51 of FIG. 2 in that the dark current suppression layer 63 is replaced with a dark current suppression layer 161.

That is, the dark current suppression layer 161 is configured to have a range of the electron affinity between a value smaller than the electron affinity of the photoelectric conversion layer 64 by 0.25 eV and a value greater than the electron affinity of silicon by 0.25 eV.

Accordingly, it is possible to provide the dark current suppression layer 161 which does not interfere with a transfer of a signal.

Sixth Embodiment

Sixth Configuration Example of the Solid-State Imaging Device

FIG. 11 is a cross-sectional view which shows another configuration example of the solid-state imaging device to which the present disclosure is applied. In an example of FIG. 11, it is exemplified that one photoelectric conversion device which configures the solid-state imaging device includes a dark current suppression layer which also serves as a charge blocking layer.

A solid-state imaging device 181 of FIG. 11 is in common with the solid-state imaging device 111 of FIG. 7 in that they include the silicon substrate 61, the charge accumulation layer 62, the photoelectric conversion layer 64, the electrode layer 65, the transfer gate 66, and the charge blocking layer 122. The solid-state imaging device 181 of FIG. 11 is different from the solid-state imaging device 111 of FIG. 7 in that the dark current suppression layer 63 is replaced with a dark current suppression layer 191 and the charge blocking layer 121 is removed.

That is, since the dark current suppression layer 191 is not a barrier to electrons, but is a barrier to a hole by using a GaP-based material, the dark current suppression layer 191 is formed as a dark current suppression layer which also serves as a charge blocking layer on the silicon substrate 61.

Accordingly, it is possible to obtain the same effect as in the solid-state imaging device 111 of FIG. 7. In addition, the solid-state imaging device 181 of FIG. 11 can be formed thinner than the solid-state imaging device 111 of FIG. 7 by one layer.

In the above description, a solid-state imaging device of frontside illumination type is described. However, as to be described below, the present disclosure can be applied even to a solid-state imaging device of a backside illumination type.

Seventh Embodiment

Seventh Configuration Example of the Solid-State Imaging Device

Figure 12:
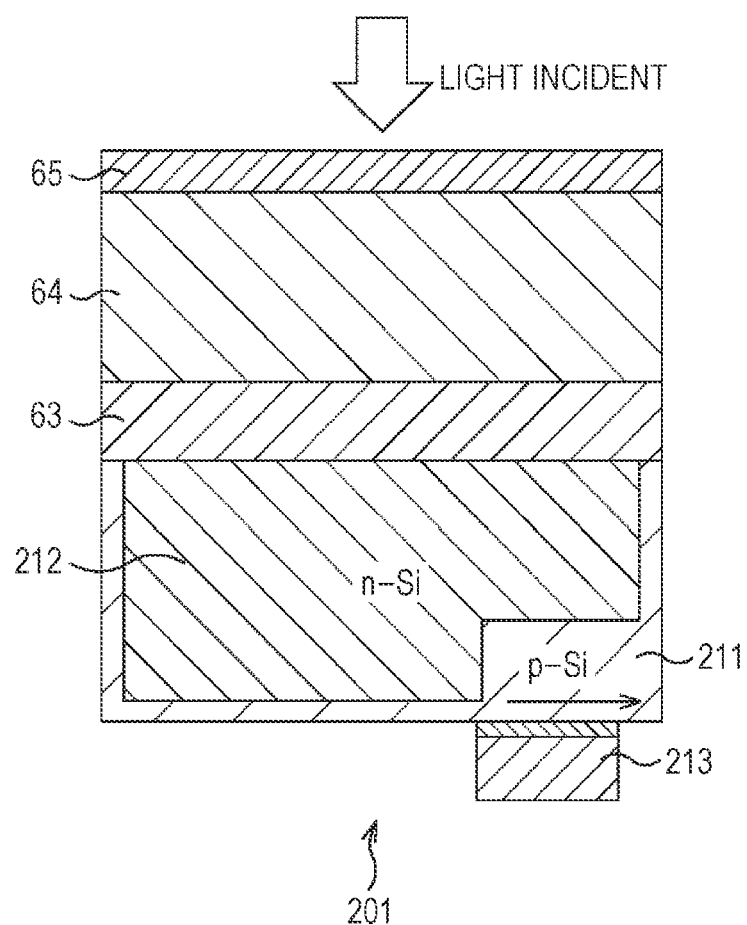
FIG. 12 is a cross-sectional view which shows a configuration example of a solid-state imaging device of a seventh embodiment of the present disclosure.

FIG. 12 is a cross-sectional view which shows another configuration example of the solid-state imaging device to which the present disclosure is applied. In an example of FIG. 12, one photoelectric conversion device of the backside illumination-type solid-state imaging device is exemplified.

A solid-state imaging device 201 of FIG. 12 is in common with the solid-state imaging device 51 of FIG. 2 in that they include the dark current suppression layer 63, the photoelectric conversion layer 64, and the electrode layer 65. The solid-state imaging device 201 of FIG. 12 is different from the solid-state imaging device 51 of FIG. 2 in that the silicon substrate 61 is replaced with a silicon substrate 211, the charge accumulation layer 62 is replaced with a charge accumulation layer 212, and the transfer gate 66 is replaced with a transfer gate 213. The silicon substrate 211, the charge accumulation layer 212, and the transfer gate 213 are only provided at different positions, but are the same as the silicon substrate 61, the charge accumulation layer 62, and the transfer gate 66 of the solid-state imaging device 51 in FIG. 2 in operations and the like.

The solid-state imaging device 201 has a feature of a backside illumination-type image sensor that sensitivity is high by efficiently performing photoelectric conversion due to incident light from the back surface side (upper surface of FIG. 12) on which a transistor, a wiring, or the like is not formed. In particular, it is possible to shallow a depth of photoelectric conversion by using the photoelectric conversion layer 64 with a high light absorption coefficient. Therefore, it is possible to greatly improve a color mixture due to oblique light in principle.

In the same manner as a case of the solid-state imaging device 51 of FIG. 2, the silicon substrate 211 is prepared, and the charge accumulation layer 212 is formed in the silicon substrate 211. Then, the silicon substrate 211 is thinned by Chemical Mechanical Polishing (CMP) and the like. Since the solid-state imaging device 201 in FIG. 12 is a backside illumination-type, defects such as dangling bonds are generated on the back interface of the silicon substrate 211 to become a dark current source, it is necessary to have a Hole Accumulation Diode (HAD) structure which induces a hole.

However, deterioration of a dark current is suppressed by forming the dark current suppression layer 63, the photoelectric conversion layer 64, and the electrode layer 65 on a back surface side of the silicon substrate 211 in the same manner as the solid-state imaging device 51 of FIG. 2 without forming HAD structure, and thereby it is possible to realize the solid-state imaging device 201 with high sensitivity in which the chalcopyrite-based compound semiconductor that is a photoelectric conversion film with high light absorption coefficient is set to a photoelectric conversion device.

For example, in solid-state imaging device of only having a photoelectric conversion layer lattice matched to a silicon back interface, the dark current caused by dangling bonds can be suppressed. However, deterioration of a dark current by the generation of defects in a mid-gap of silicon caused by a photoelectric conversion layer material at silicon interface at the beginning of formation of photoelectric conversion layer material may not be suppressed. In contrast, according to the solid-state imaging device 201 in FIG. 12, since a defect in the mid-gap of silicon caused by a photoelectric conversion layer material is not generated on a silicon interface at a beginning of a formation of the photoelectric conversion layer material, it is possible to suppress the deterioration of a dark current.

Eighth Embodiment

Eighth Configuration Example of the Solid-State Imaging Device

Figure 13:
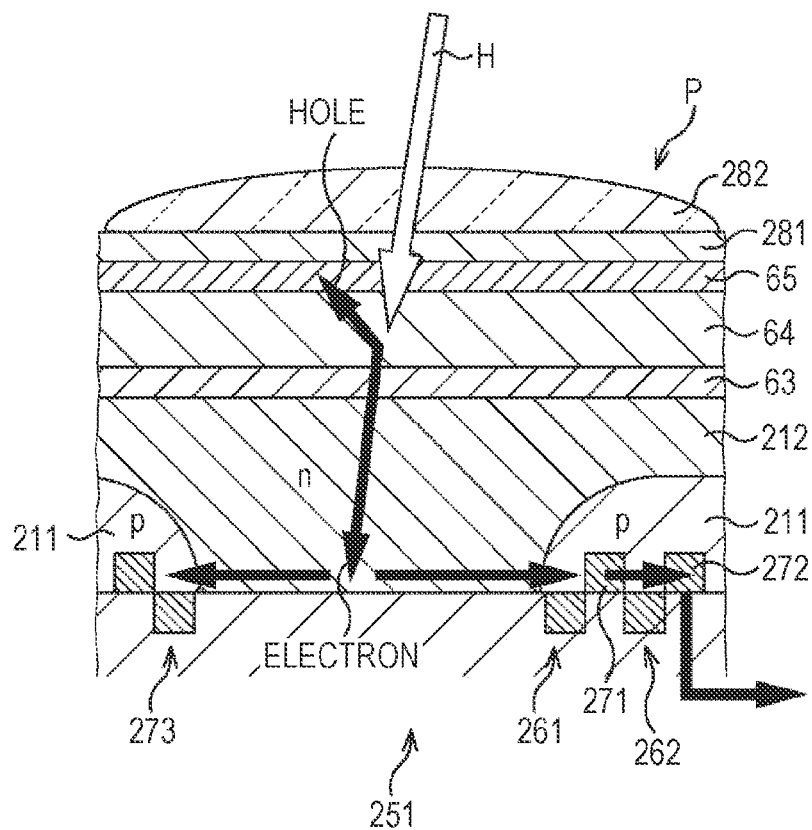
FIG. 13 is a cross-sectional view which shows a configuration example of a solid-state imaging device of an eighth embodiment of the present disclosure.

FIG. 13 is a cross-sectional view which shows another configuration example of the solid-state imaging device to which the present disclosure is applied. In an example of FIG. 13, one photoelectric conversion device of the backside illumination-type solid-state imaging device which has a global shutter function is exemplified.

A solid-state imaging device 251 of FIG. 13 is in common with the solid-state imaging device 201 of FIG. 12 in that they include the dark current suppression layer 63, the photoelectric conversion layer 64, the electrode layer 65, the silicon substrate 211, and the charge accumulation layer 212.

The solid-state imaging device 251 of FIG. 13 is different from the solid-state imaging device 201 of FIG. 12 in that the transfer gate 213 is replaced with gate MOSs 261 and 262, and an n-type impurity regions 271 and 272, and a PD reset transistor 273 are added. In addition, a color filter 281 and a microlens 282 which are formed on the electrode layer 65 are also illustrated in the solid-state imaging device 251.

In the solid-state imaging device 251, the dark current suppression layer 63 is formed between the photoelectric conversion layer 64 and the silicon substrate 211. The photoelectric conversion layer 64 and the dark current suppression layer 63 are provided so as to cover an upper surface of the charge accumulation layer 212 which is formed so as to correspond to a plurality of pixels P in the silicon substrate 211. It is preferred that impurity of the charge accumulation layer 212 be distributed so that an impurity concentration becomes higher toward a lower surface from an upper surface of the silicon substrate 211. By doing so, it is possible to naturally move electrons moving from the photoelectric conversion layer 64 to sides of the gate MOSs 261 and 262 on the charge accumulation layer 212.

Then, as shown in FIG. 13, the electrode layer 65 is provided on an upper surface (back surface) of the photoelectric conversion layer 64, and the color filter 281 and the microlens 282 are provided corresponding to a pixel P on an upper surface of the electrode layer 65. The electrode layer 65 is grounded, and is configured to prevent charges by hole accumulation. For example, the color filter 281 includes filters of three primary colors. Then, for example, the filters of three primary colors are disposed in each pixel P in a Bayer array. The array is not limited to the Bayer array. The microlens 282 is an on-chip lens, and is provided so as to protrude in a convex shape above the silicon substrate 211, and concentrates incident light H from the above on the photoelectric conversion layer 64.

The gate MOSs 261 and 262 are configured to output a generated signal charge (electron) to a gate of an amplification transistor which is not shown as electrical signal. As shown in FIG. 13, the gate MOSs 261 and 262 are provided on an opposite side surface (front surface) to a surface (back surface) on which the photoelectric conversion layer 64 is provided on the silicon substrate 211.

The PD reset transistor 273 is one of a plurality of transistors which configure a read circuit (not shown) provided on the silicon substrate 211, and, for example, is configured to reset a potential of the photoelectric conversion layer 64.

In the solid-state imaging device 251, after receiving incident light is started at the same time in all of the pixels P, global exposure to terminate the light receiving is performed without using a mechanical light-blocking unit. That is, the solid-state imaging device 251 has a "global shutter function" and performs light exposure with this.

Specifically, as shown in FIG. 13, the incident light H is incident on the photoelectric conversion layer 64 from the above of the silicon substrate 211 through each portion. Then, a generated electron (signal charge) is moved to the charge accumulation layer 212 of the silicon substrate 211 and a hole is moved to the electrode layer 65 in the photoelectric conversion layer 64 on which the incident light H is incident.

Then, a PD is reset right after signal charges accumulated on the charge accumulation layer 212 by the gate MOS 261 are transferred to the n-type impurity region 271. That is, the charge accumulation layer 212 is connected to the ground by the PD reset transistor 273, and a potential is reset to a voltage 0V (or power voltage Vdd). Immediately thereafter, signal charge accumulation is started in the charge accumulation layer 212.

Then, the signal charges are transferred to the n-type impurity region 272 (FD: floating diffusion) and accumulated by the gate MOS 262.

Such an operation is performed in all pixels P. Then, a read circuit not illustrated reads the signal charge in each pixel P and outputs the signal charge to the vertical signal line which is not illustrated as an electrical signal.

As described above, the present disclosure can be applied to a backside illumination-type solid-state imaging device which has a global shutter function as described above.

According to the present disclosure, it is possible to suppress a dark current. In particular, according to the present disclosure, even if using the chalcopyrite-based material for the photoelectric conversion layer, it is possible to suppress a dark current.

That is, according to the present disclosure, it is possible to realize a solid-state imaging device with high sensitivity which sets a chalcopyrite-based compound semiconductor that is a photoelectric conversion film having a high light absorption coefficient to be a photoelectric conversion device while suppressing deterioration of a dark current.

In the above, a configuration in which the present disclosure is applied to a CMOS solid-state imaging device is described; however, the present disclosure may be applied to a solid-state imaging device such as a Charge Coupled Device (CCD) solid-state imaging device. In addition, the present disclosure can be applied to a lamination type solid-state imaging device.

The present disclosure is not limited to an application to the solid-state imaging device, but is also applicable to an imaging device. Here, the imaging device means a camera system such as a digital still camera, a digital video camera, or the like, or an electronic apparatus which has an imaging function such as a mobile phone or the like. A mode of a module shape mounted on the electronic apparatus, that is, a camera module, is regarded as the imaging device in some cases.

Ninth Embodiment

Configuration Example of Electronic Apparatus

Here, a configuration example of an electronic apparatus to which the present disclosure is applied will be described referring to FIG. 14.

Figure 14:
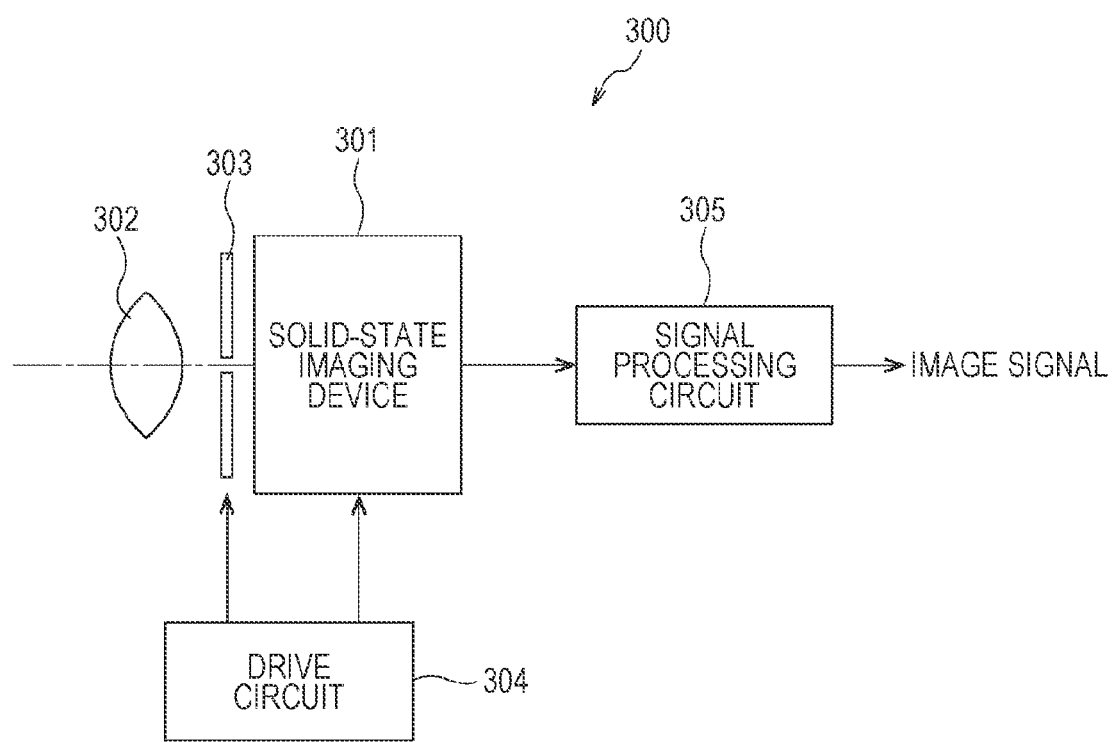
FIG. 14 is a block diagram which shows a configuration example of an electronic apparatus of a ninth embodiment of the present disclosure.

An electronic apparatus 300 shown in FIG. 14 includes a solid-state imaging device (device chip) 301, an optical lens 302, a shutter device 303, a drive circuit 304, and a signal processing circuit 305. As the solid-state imaging device 301, a solid-state imaging device according to any one of the first to eighth embodiments of the present disclosure described above may be provided. Accordingly, a dark current can be suppressed. As a result, it is possible to provide an electronic apparatus including an imaging device with high sensitivity.

The optical lens 302 forms an image light (incident light) from a subject onto an imaging surface of the solid-state imaging device 301. Accordingly, signal charges are accumulated in the solid-state imaging device 301 for a given period of time. The shutter device 303 controls a light irradiation period and a shading period for the solid-state imaging device 301.

The drive circuit 304 provides a drive signal which controls a signal transfer operation of the solid-state imaging device 301 and a shutter operation of the shutter device 303. With the drive signal (timing signal) provided from the drive circuit 304, the solid-state imaging device 301 performs a signal transfer. The signal processing circuit 305 performs various types of signal processing with respect to a signal output from the solid-state imaging device 301. An image signal which is signal-processed is stored in a storage medium such as a memory and the like, or is output to a monitor.

In the present specification, steps of describing a series of the processings includes not only processing performed in time series along a description order, but also processing performed individually or in parallel even if not surely processed in time series.

Moreover, embodiments in the present disclosure are not limited to the embodiments described above, and various modifications can be made in a range without departing from a scope of the present disclosure.

In the above, a configuration described as one device (or processing unit) may be split into a plurality of devices (or processing units). Conversely, a configuration described as a plurality of devices (or processing units) in the above may be settled to be one device (or processing unit). Moreover, a configuration other than those described above can be added to a configuration of each device (or each processing unit). Furthermore, if configurations or operations of an entire system are substantially the same as each other, a portion of a configuration of a certain device (or processing unit) may be included in a configuration of another device (or another processing unit). That is, the present disclosure is not limited to embodiments described above, and various modifications are possible in a range without departing from a scope of the present disclosure.

As described above, preferred embodiments of the present disclosure are described in detail with reference to accompanying drawings; however, the disclosure is not limited to such examples. It will be appreciated by those skilled in a field of technology to which present disclosure belongs that various changes or alternations may apparently made within a scope of technical concepts described in the claims, and may belong to a technical scope of the present disclosure.

The present disclosure can adopt a following configuration.

(1)

A solid-state imaging device includes a photoelectric conversion device that includes a non-chalcopyrite-based compound semiconductor of at least one layer, which is lattice bonded or pseudo lattice bonded, and is formed on a silicon substrate, and a chalcopyrite-based compound semiconductor of at least one layer which is formed on the non-chalcopyrite-based compound semiconductor.

(2)

The solid-state imaging device described in (1), in which the photoelectric conversion device further includes a charge accumulation layer formed on the silicon substrate.

(3)

The solid-state imaging device described in (1) or (2), in which the solid-state imaging device is a backside illumination type.

(4)

The solid-state imaging device described in any one of (1) to (3), in which the solid-state imaging device has a global shutter function.

(5)

The solid-state imaging device described in any one of (1) to (4), in which a first layer of the non-chalcopyrite-based compound semiconductor, which is in contact with the silicon substrate, is made of atoms that do not have a defect level around a mid-gap of Si.

(6)

The solid-state imaging device described in (5), in which the first layer of the non-chalcopyrite-based compound semiconductor, which is in contact with the silicon substrate, is made of atoms that do not have a defect level within ±0.1 ev from a mid-gap of Si.

(7)

The solid-state imaging device described in any one of (1) to (6), in which the first layer of the non-chalcopyrite-based compound semiconductor, which is in contact with the silicon substrate, is made of a combination of at least two or more of Li, Sb, N, P, As, Bi, Te, Ti, C, Mg, Se, Cr, Ta, Ag, Pt, B, Al, Ga, In, Tl, Pd, Na, Be, Ni, Mo, Hg, K, Sn, W, Pb, O, Fe, C, Cl, Ca, and F.

(8)

The solid-state imaging device described in any one of (1) to (7), in which the first layer of the non-chalcopyrite-based compound semiconductor, which is in contact with the silicon substrate, includes at least one of GaP, AlP, AgCl, and CaF2.

(9)

The solid-state imaging device described in any one of (1) to (8), in which the non-chalcopyrite-based compound semiconductor has a band gap equal to or more than that of Si.

(10)

The solid-state imaging device described in any one of (1) to (9), in which a range of an electron affinity of the non-chalcopyrite-based compound semiconductor is between a value which is smaller than an electron affinity of the chalcopyrite-based compound semiconductor by a predetermined value and a value which is greater than an electron affinity of Si by a predetermined value.

(11)

The solid-state imaging device described in (10), in which the range of electron affinity of the non-chalcopyrite-based compound semiconductor is between a value which is smaller than an electron affinity of the chalcopyrite-based compound semiconductor by 0.25 eV and a value which is greater than an electron affinity of Si by 0.25 eV.

(12)

The solid-state imaging device described in any one of (1) to (11), in which the photoelectric conversion device has a charge blocking layer at least one of between the non-chalcopyrite-based compound semiconductor and the chalcopyrite-based compound semiconductor, and between the chalcopyrite-based compound semiconductor and an upper electrode.

(13)

The solid-state imaging device described in (12), in which the non-chalcopyrite-based compound semiconductor also serves as the charge blocking layer.

(14)

The solid-state imaging device described in any one of (1) to (13), in which the non-chalcopyrite-based compound semiconductor is changed stepwise in a composition of materials or impurity concentration.

(15)

The solid-state imaging device described in any one of (1) to (14), in which the chalcopyrite-based compound semiconductor is changed stepwise in a composition of materials or impurity concentration.

(16)

The solid-state imaging device described in any one of (1) to (15), in which the chalcopyrite-based compound semiconductor is lattice matched or pseudo-lattice matched.

(17)

The solid-state imaging device described in any one of (1) to (16), in which the silicon substrate is formed of p-type silicon, and the charge accumulation layer is formed of n-type silicon.

(18)

An electronic apparatus includes a solid-state imaging device including a photoelectric conversion device that includes a non-chalcopyrite-based compound semiconductor of at least one layer, which is lattice bonded or pseudo lattice bonded, and is formed on a silicon substrate, and a chalcopyrite-based compound semiconductor of at least one layer which is formed on the non-chalcopyrite-based compound semiconductor, an optical system which allows an incident light to be incident on the solid-state imaging device, and a signal processing circuit which processes an output signal output from the solid-state imaging device.

(19)

The electronic apparatus described in (18), in which the photoelectric conversion device further includes a charge accumulation layer formed on the silicon substrate.

(20)

The electronic apparatus described in (18) or (19), in which the electronic apparatus is a backside illumination type.

(21)

The electronic apparatus described in any one of (18) to (20), in which the electronic apparatus has a global shutter function.

(22)

The electronic apparatus described in any one of (18) to (21), in which the chalcopyrite-based compound semiconductor is lattice matched or pseudo lattice matched.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
   a photoelectric conversion device that includes:
      a non-chalcopyrite-based compound semiconductor of at least one layer, which is lattice bonded or pseudo lattice bonded, and is formed on a silicon substrate;
      a chalcopyrite-based compound semiconductor of at least one layer which is formed on the non-chalcopyrite-based compound semiconductor; and
   a charge accumulation layer formed on the silicon substrate, wherein the photoelectric conversion device has a charge blocking layer at least one of between the non-chalcopyrite-based compound semiconductor and the chalcopyrite-based compound semiconductor, and between the chalcopyrite-based compound semiconductor and an upper electrode.

2. The solid-state imaging device according to claim 1, wherein the solid-state imaging device is a backside illumination type.

3. The solid-state imaging device according to claim 1, wherein the solid-state imaging device has a global shutter function.

4. The solid-state imaging device according to claim 1, wherein the first layer of a non-chalcopyrite-based compound semiconductor, which is in contact with the silicon substrate, is made of atoms that do not have a defect level around a mid-gap of Si.

5. The solid-state imaging device according to claim 4, wherein the first layer of the non-chalcopyrite-based compound semiconductor, which is in contact with the silicon substrate, is made of atoms that do not have a defect level within ±0.1 ev from a mid-gap of Si.

6. The solid-state imaging device according to claim 4, wherein the first layer of the non-chalcopyrite-based compound semiconductor, which is in contact with the silicon substrate, is made of a combination of at least two or more of Li, Sb, N, P, As, Bi, Te, Ti, C, Mg, Se, Cr, Ta, Ag, Pt, B, Al, Ga, In, Tl, Pd, Na, Be, Ni, Mo, Hg, K, Sn, W, Pb, O, Fe, C, Cl, Ca, and F.

7. The solid-state imaging device according to claim 6, wherein the first layer of the non-chalcopyrite-based compound semiconductor, which is in contact with the silicon substrate, includes at least one of GaP, AlP, AgCl, and CaF2.

8. The solid-state imaging device according to as claim 1, wherein the non-chalcopyrite-based compound semiconductor has a band gap equal to or more than that of Si.

9. The solid-state imaging device according to claim 1, wherein a range of an electron affinity of the non-chalcopyrite-based compound semiconductor is between a value which is smaller than an electron affinity of the chalcopyrite-based compound semiconductor by a predetermined value and a value which is greater than an electron affinity of Si by a predetermined value.

10. The solid-state imaging device according to claim 9, wherein the range of electron affinity of the non-chalcopyrite-based compound semiconductor is between a value which is smaller than an electron affinity of the chalcopyrite-based compound semiconductor by 0.25 eV and a value which is greater than an electron affinity of Si by 0.25 eV.

11. The solid-state imaging device according to claim 1, wherein the non-chalcopyrite-based compound semiconductor also serves as the charge blocking layer.

12. The solid-state imaging device according to claim 1, wherein the non-chalcopyrite-based compound semiconductor is changed stepwise in a composition of materials or impurity concentration.

13. The solid-state imaging device according to claim 1, wherein the chalcopyrite-based compound semiconductor is changed stepwise in a composition of materials or impurity concentration.

14. The solid-state imaging device according to claim 1, wherein the chalcopyrite-based compound semiconductor is lattice matched or pseudo-lattice matched.

15. The solid-state imaging device according to claim 1, wherein the silicon substrate is formed of p-type silicon, and the charge accumulation layer is formed of n-type silicon.

16. An electronic apparatus comprising:
a solid-state imaging device including a photoelectric conversion device that includes a non-chalcopyrite-based compound semiconductor of at least one layer, which is lattice bonded or pseudo lattice bonded, and is formed on a silicon substrate, a chalcopyrite-based compound semiconductor of at least one layer which is formed on the non-chalcopyrite-based compound semiconductor, and a charge accumulation layer formed on the silicon substrate, wherein the photoelectric conversion device has a charge blocking layer at least one of between the non-chalcopyrite-based compound semiconductor and the chalcopyrite-based compound semiconductor, and between the chalcopyrite-based compound semiconductor and an upper electrode;
an optical system which allows an incident light to be incident on the solid-state imaging device; and
a signal processing circuit which processes an output signal output from the solid-state imaging device.

17. The electronic apparatus according to claim 16, wherein the photoelectric conversion device further includes a charge accumulation layer formed on the silicon substrate.

18. The electronic apparatus according to claim 17, wherein the electronic apparatus is a backside illumination type.

19. The electronic apparatus according to claim 17, wherein the electronic apparatus has a global shutter function.

20. The electronic apparatus according to claim 17, wherein the chalcopyrite-based compound semiconductor is lattice matched or pseudo lattice matched.

* * * * *